Feb. 23, 1971 R. BRUCKNER ET AL 3,566,299

MULTI-BAND SIGNAL GENERATOR WITH SWITCHED OSCILLATORS GROUPED AROUND A COMMON TUNING CAPACITOR

Filed April 3, 1969 3 Sheets-Sheet 1

INVENTORS

Reinhard Bruckner, Jacob Gropp, Gerd Meyer-Marc & Hans Egon Ramundt

BY Hill, Sherman, Meroni, Gross & Simpson ATTYS.

Feb. 23, 1971 R. BRUCKNER ET AL 3,566,299

MULTI-BAND SIGNAL GENERATOR WITH SWITCHED OSCILLATORS GROUPED AROUND A COMMON TUNING CAPACITOR

Filed April 3, 1969 3 Sheets-Sheet 2

INVENTORS
Reinhard Bruckner, Jacob Gropp, Gerd Meyer-Marc & Hans Egon Ramundt

BY Hill, Sherman, Meroni, Gross & Simpson ATTYS.

INVENTORS
Reinhard Bruckner, Jacob Gropp,
Gerd Meyer-Marc & Hans Egon Ramundt
BY Hill, Sherman, Meroni, Gross & Simpson
ATTYS.

United States Patent Office 3,566,299

Patented Feb. 23, 1971

3,566,299

MULTI-BAND SIGNAL GENERATOR WITH SWITCHED OSCILLATORS GROUPED AROUND A COMMON TUNING CAPACITOR

Reinhard Bruckner, Munich, Jacob Gropp, Kirchseeon, and Gerd Meyer-Marc and Hans Egon Ramundt, Munich, Germany, assignors to Rohde & Schwarz, a corporation of Germany Filed Apr. 3, 1969, Ser. No. 812,995
Claims priority, application Germany, Apr. 10, 1968, P 17 66 153.9; Dec. 4, 1968, P 18 12 641.5
Int. Cl. H03b 5/12; H03j 5/04
U.S. Cl. 331—49 19 Claims

ABSTRACT OF THE DISCLOSURE

Multi-band oscillator apparatus includes a plurality of independent oscillator units of which the oscillatory circuit elements are variable to determine the frequency by operation of an adjustable common tuning device and in which band-switching is accomplished by switching on and off the supply voltage to the individual oscillator units.

BACKGROUND OF THE INVENTION

Field of the invention

This invention relates to a tunable multi-band oscillator having a plurality of independent oscillator units which are selectably energized for operation and in which each of the oscillator units includes oscillatory circuit elements which are variable to determine the frequency of oscillation, and more particularly to such oscillator apparatus wherein the oscillatory circuit elements are adjustable by means of a common tuning device.

Description of the prior art

A transistorized high frequency signal generator is already known which comprises an inductively tuned multi-range oscillator with a number of independent oscillator units. Reference may be taken to the publication "Marconi Instrumentation," vol. 9, No. 7, September 1964, for a detailed description of the foregoing type signal generator. All of the inductively tuned oscillator units are simultaneously tunable in frequency by means of a common tuning device by simultaneous mechanical displacement of the cores of all of the inductor coils. Band switching is obtained by switching on and off the direct current supply for the transistors of the individual oscillator units. The tuning mechanism for simultaneous exact parallel displacement of the cores in all the coils is relatively complicated and prone to faults. Moreover, inductive tuning is only suitable for frequencies below 100 mHz. and it is also only with great difficulty that a predetermined frequency range can be set for each of the individual bands independently of the remaining oscillator units.

U.S. Pat. 2,244,023 describes a multi-band oscillator in which each of the individual coils is associated with a particular stator plate of a rotary variable capacitor and opposite these stator sectors, which are arranged in a ring like the pedals of a flower, there is arranged a further stator ring which is connected to an oscillator tube for all of the coil and capacitor elements. A common rotor is capable of being arcuately passed over these stator sectors and the stator ring, and in its continuous rotation simultaneously allows capacitive tuning of the particular coil and stator combination over which it is passing to allow tuning of the frequency. The movement from one stator plate to another automatically results in a switch in frequency band. This is also automatic tuning with simultaneous band switching by means of a single tuning device, but this arrangement is only suitable and capable of use with a common oscillator tube. Furthermore, this known circuit has disadvantages from the electrical point of view as the rotor of the variable capacitor can not lie electrically at ground potential.

SUMMARY OF THE INVENTION

The primary object of the present invention is to provide a tunable multi-band oscillator having a plurality of independent oscillator units and which is suitable for utilization at frequencies above 100 mHz. and which is capable of realization with a very simple common tuning device which employs capacitive tuning and at a minimum expenditure of circuit complements.

According to the present invention, this problem is solved in that the individual oscillator units are mounted on a ring-like pattern of sector-shaped boards embracing a common rotary variable capacitor rotor and on each sector board there is mounted at least one individual stator plate cooperating capacitively with the rotor.

In a tunable multi-band oscillator according to the present invention there are thus combined the advantages of simple and extremely fault-free band switching by simply switching on and off the direct current supply to the individual stationary transistor oscillator units arranged in a ring around the rotor, with the advantages of rotary variable capacitor tuning. By appropriate individual special choice of the dimensions of the stator plates of the individual oscillator units, the extents of the frequency ranges for the individual bands can be very easily set independently of one another. Above all, it is also possible, by two or more mutually independent stator layers per sector plate, to obtain simultaneously with the tuning of the oscillator frequency, the frequency-dependent capacitive coupling of other circuit elements. For example, a varactor diode for frequency modulation of the oscillator or another similar feedback or coupling element may be coupled to the circuit in accordance with the adjusted frequency. The complete multi-band oscillator can be mounted in a closed housing, encapsulated completely as a unit, but with only the rotor shaft extending through the housing to the exterior. The electrical connections for an oscillator so packaged would comprise a single output terminal common to all the oscillator units, and the direct current supply connections leading to the interior of the housing from the outside for switching from band to band resulting in extremely good frequency stability.

BRIEF DESCRIPTION OF THE DRAWINGS

The above and other objects, features and advantages will become apparent and the invention, its organization, construction and operation will be best understood by reference to the following description taken in conjunction with the accompanying drawings, in which.

DESCRIPTION OF THE PREFERRED EMBODIMENT

A tunable multi-band oscillator according to the invention comprises a number of independent oscillator units. In the embodiment illustrated herein, only six independent oscillator units are shown for sake of simplicity and clarity, and only three units E1, E2, and E3 are explained in detail.

Figure 3:
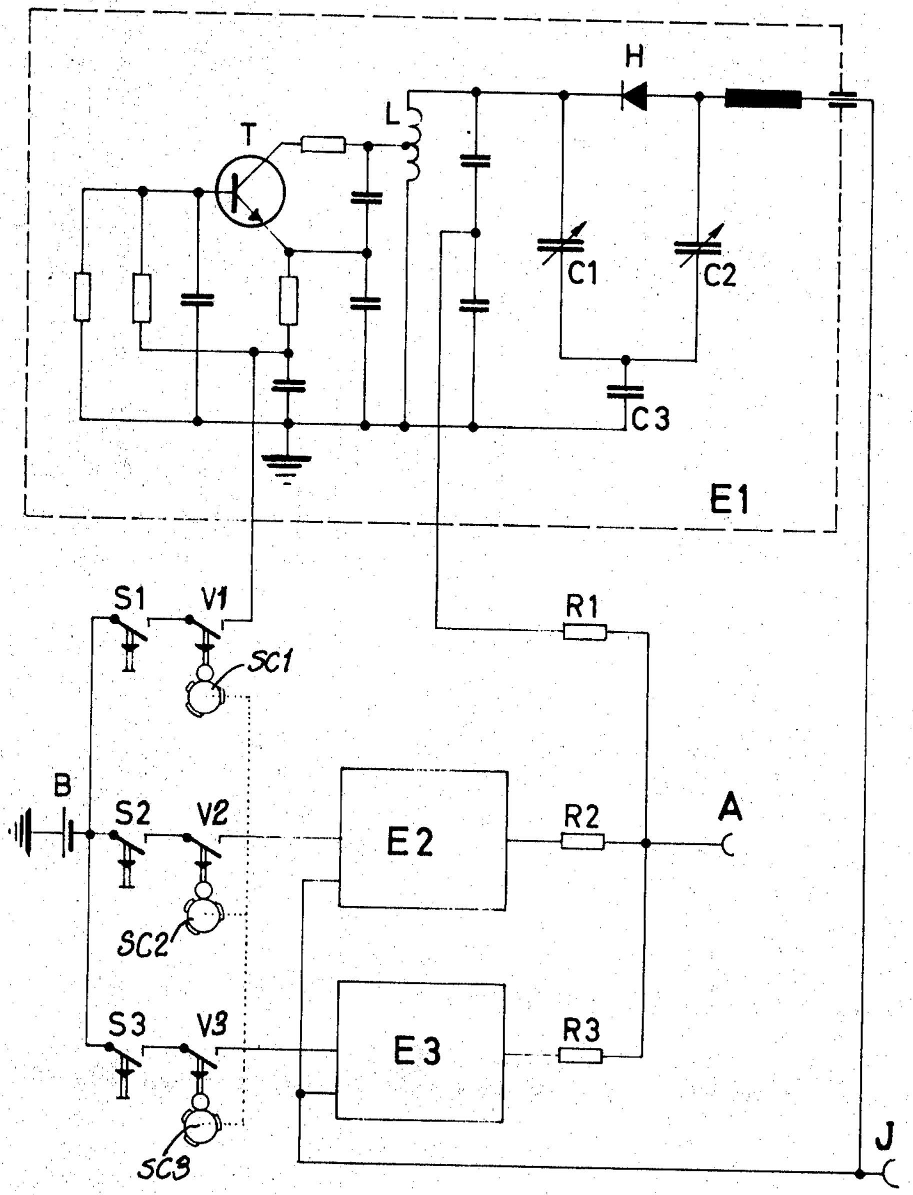
FIG. 3 illustrates the overall electrical circuit of the multi-band oscillator of FIGS. 1 and 2.

Referring to FIG. 3, each of these oscillator units comprises a transistor T and an oscillatory circuit formed by an inductance L and the variable capacitor C1 and, if necessary, the variable capacitor C2, the two of them being connected in parallel to ground through a large capacity grounding capacitor C3. The rotatable capacitor C1 serves for determining the frequency and the capacitor C2 serves for frequency-dependent parallel connection of a varactor diode H which has the control voltage fed to it from outside through a terminal J as will be further described with reference to FIG. 4. By suitable shaping of the profile of the capacitor plates of C2 frequency modulation is possible with a deviation independent of carrier frequency. The high-frequency output voltage of the oscillator is fed through the decoupling resistors R1, R2 and R3 to a common output terminal A. The decoupling resistors are chosen to be of such a value that an output impedance of exactly 50 ohms is obtained. Each oscillator unit E1, E2, and E3 has a supply voltage switch S1, S2 or S3 respectively associated with it, through which the oscillator units are capable of connection to the voltage supply B. Band switching is obtained by means of this switch S.

Figure 2:
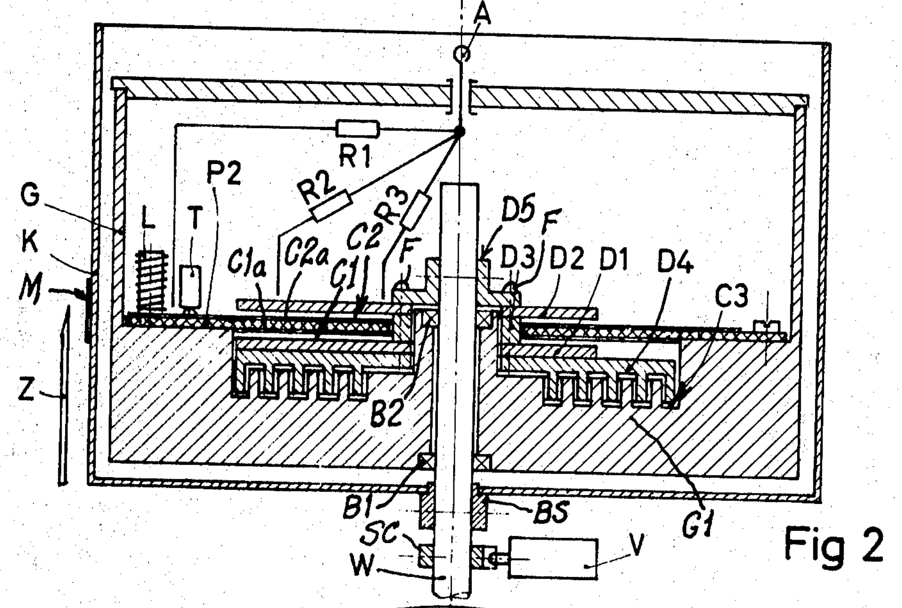
FIG. 2 is an elevational cross-sectional view taken along the line II—II of FIG. 1.
Figure 1:
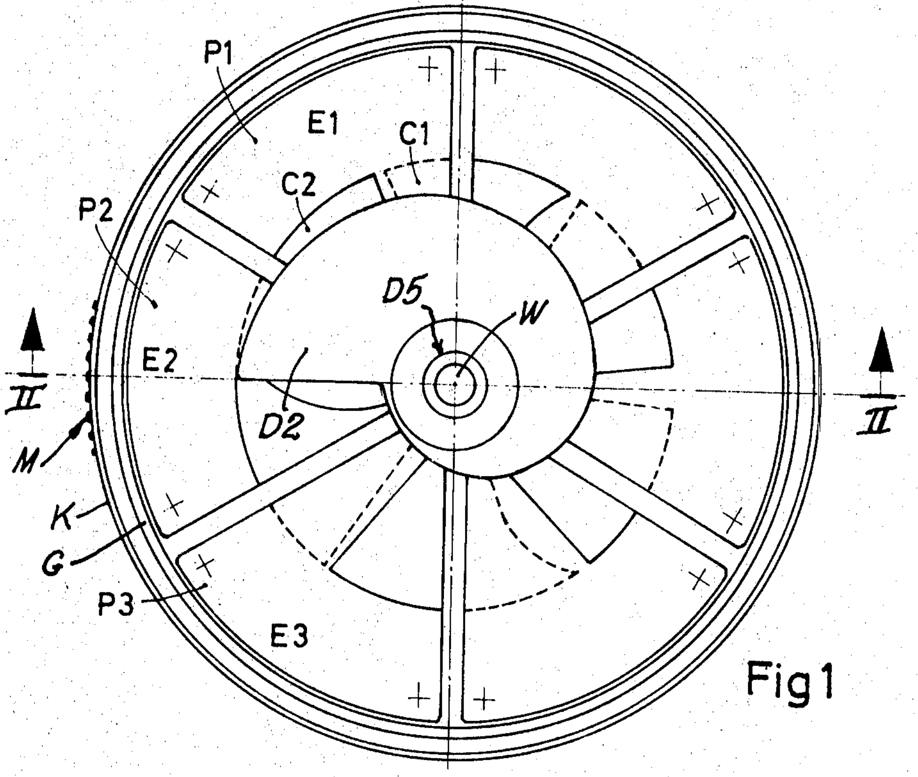
FIG. 1 illustrates a multi-band oscillator, with its housing cover removed, constructed in accordance with the principles of the present invention.

Referring to FIGS. 1 and 2, each oscillator unit E1, E2 and E3 is built on a sector-shaped board P1, P2 or P3 respectively in accordance with printed circuit techniques. The variable capacitors C1 and C2 are each formed by a stator layer plate C1*a* and C2*a* and are mounted on the two faces of the circuit board according to printed circuit techniques, being formed simultaneously with the manufacture of the leads to the oscillator unit. The sector-shaped circuit boards P1, and P2 and P3 are arranged rigidly in a fixed ring-shaped pattern within a housing G around a rotatable spindle W on which the co-operating rotor plates D1 and D2 are secured. The rotor thus formed passes successively over the stator layers C1 and C2 on the circuit board as the rotor turns, and by the capacitive co-operation of the rotor plates D1 and D2 with the stator layers C1*a* and C2*a* on the two faces of the interposed sector-shaped circuit board the variable capacitors C1 and C2 illustrated in the circuit of FIG. 3 are formed. The stator layers C1*a* and C2*a* mounted on the two faces are electrically connected together at the edges of the boards by metallic coatings. Only at that edge of the boards P1, P2 and P3 facing the spindle W is this connecting edge coating omitted, so as not to make the minimum capacity larger than necessary. The rotor formed by the plates D1 and D2 is electrically connected to the housing G through a very large-value grounding capacitor C3. For this purpose the floor G1 of the housing G, is provided for example, with concentric rings which co-operate capacitatively with corresponding rings of an additional disc D4 mounted on the underside of the rotor plate D1, in the manner of a piston-type trimmer. The spindle W is rotatably mounted in a bearing B in the housing. The two rotor plates D1 and D2 are held spaced apart by a metal ring D3. Since the boards P1, P2 and P3 are made of a ceramic material which has about the same coefficient of thermal expansion as ceramic so that changes of temperature do not cause any upsetting changes in frequency since then all of the components expand linearly in an axial direction and so the effective capacity of the capacitors C1, C2 and C3 remains uniform.

The tuning scale for the multi-band oscillator can be arranged in a simple manner in the form of a cylindrical drum K directly around the periphery of the housing G and it can be drivingly connected in a suitable manner to the rotor spindle W either directly or through a suitable reduction drive. Then it is simply necessary to provide a pointer Z at the outer periphery to read scale M. The rotor spindle W can co-operate in a known manner with a fine/coarse drive.

As seen in FIG. 1, the rotor need not employ the whole available angle of rotation of 360°. According to the number of oscillator units present the effective angular range of rotation of the rotor can be correspondingly reduced and in fact the possible angular rotation for the rotor can be in accordance with the following formula:

$$360° - \frac{360°}{X}$$

where X is the number of sector boards, which in the embodiment illustrated is three. In practice one will select this maximum usable angular rotation to be somewhat smaller than this in general, in order to reduce edge effects in the variable capacitor at the change over regions between bands.

On the changeover from one oscillator to the next, i.e. on band switching, care must further be taken that the two oscillators which pass through the same resonance frequency in the region of overlap, do not influence each other. From FIG. 1 it is evident that, for example, if the oscillator unit E2 is on and the broadest portion of the rotor is over it, so that it has reached the limit of its band, the next following oscillator unit E1 should still not yet be switched on so long as the oscillatory circuit of the unit E2 has still not yet passed through the resonance frequency of that oscillator unit which immediately follows it in frequency. Care must therefore be taken that at the start of the next following frequency band the smallest rotor section only starts to co-operate capacitatively with the stator plates of the unit E1, and that this unit E1 is only connected to its supply voltage, when the broadest portion of the rotor has already been turned so far out of the region of the stator plates of the unit E2 that the tuning of the oscillatory circuit of the unit E2 no longer corresponds to the frequency produced by the unit E1. For this purpose additional switching cams (SC1, SC2, SC3 FIG. 3) are mounted on the rotor spindle W, which co-operate with microswitches V which are connected in the direct current supply conductors of the oscillator units and prevent the oscillator units being switched on during this dead region, necessary on electrical grounds, of the variable capacitor.

In a multi-band oscillator according to the invention the electrical dimensions of the oscillator unit can be arranged so that an overall frequency range is scanned without any gaps in successive part ranges or bands. However it will be evident that it is possible for the individual oscillator units to be tuned equally well to selected partial ranges or bands which are not mutually adjacent. If a continuous succession of bands is desired then it can further be of advantage to arrange for automatic scale switching after completion of the traverse of a band and to provide a reduction gear between the rotor shaft and the pointer Z for reading the scale so that automatically on a complete rotation of the scale the next scale division on the drum K is selected. In this way it can also be arranged that all the scales have the same starting point and the maximum possible scale length on the drum is put to use.

A particularly favorable scale arrangement is obtained if an odd number of oscillator units is arranged around the rotor, for example, seven units, arranged in the sequence 1, 3, 5, 7, 2, 4, 6, 1 and so on and simultaneously the unused sector of the rotor, i.e. that sector of the rotor plate portion by which the rotor is reduced as compared with the full angular range of 360°, is made equal to or somewhat smaller than 360° divided by the number of oscillator units. With, for example, seven oscillator units arranged in a petal-like pattern around the rotor, this unused rotor sector is therefore equal to or smaller than 51.4°, for example 50° to 45°, i.e. the rotor should have a plate portion which takes up an angular range from about 308.6° to 315°. In this way it is possible for the individual oscillator bands on band switching to follow one another without a break and thereby an almost continuous scale is obtained. Here moreover additional switching steps, which avoid interference between the resonance frequencies of adjacent oscillator units, are superfluous. By the somewhat larger selected angular range of the rotor the result is achieved that even at the broadest end of the rotor, i.e. in the region where a band switch occurs, a clearly defined capacity is present.

As shown in FIG. 1 the peripheral shape of the stator layers for C1 is chosen to be different in the individual oscillator units E1, E2 and E3. In this way it is possible even with band ranges of differing frequency range (ratio of the lowest to the highest frequency in the bank), for an extremely linear scale division to be chosen and set for all the oscillator units independently of one another. Likewise, by differing peripheral form of the stator plate layer C2*a* a very linear modulation characteristic for frequency modulation of the oscillator can be set. It will be evident that it is possible also at any time to provide further additional stator layers and in this way to provide in the circuits of the oscillator units still further frequency-dependent capacitors with respect to ground, for example to meet optimum feed-back or decoupling requirements.

Figure 4:
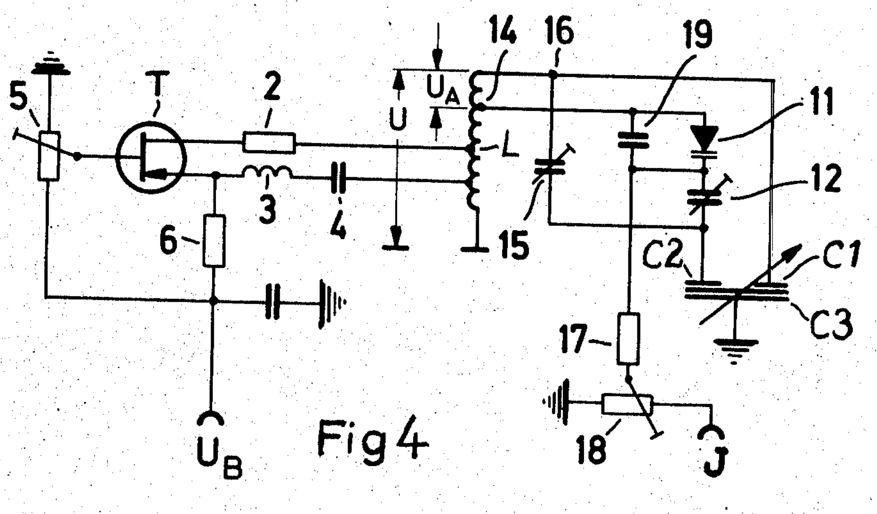
FIG. 4 illustrates details of a frequency control circuit for a multi-band oscillator according to the present invention.

The oscillator unit illustrated in FIG. 4 makes possible very exact constant frequency deviation, even over extremely large ranges of frequency variation. It again comprises a transistor T connected through coupling elements 2, 3 and 4 for generating the oscillations connected to the associated oscillatory circuit. The frequency-dependent coupling elements 3 and 4 and the damping resistor 2 serve in connection with the transistor current, set to the optimum through the potentiometer 5 and the resistor 6, to reduce the high frequency distortion factor and thus provide a constant frequency deviation. The oscillatory circuit again comprises the coil L and the parallel-connected variable tuning capacitor C1, C3. In parallel with coil L there is also further the series connection of a varactor diode 11, a trimming capacitor 12 and a variable follower or repeater capacitor C2, C3. This series connection leads to a tapping 14 on the coil L. Between the upper end 16 of the coil L and the connecting point between the trimming capacitor 12 and the stator body C2 of the follower capacitor there is connected a still further trimming capacitor 15. The frequency modulation is obtained by varying the potential on the controllable capacitor 11 through a resistor 17 and a potentiometer 18. The modulation low-frequency signal is applied to the input terminal J. The common rotor of the tuning and follower variable capacitors C1 and C2 is grounded capacitatively as described above through the additional grounding capacitor C3.

The reactive current through the initial capacity of the follower capacitor C2 is partially neutralized by the trimming capacitor 15 so that at the upper end of the frequency range the same frequency deviation is obtained as at the lower end. For intermediate frequency values this is obtained by the appropriate shaping of the periphery of the stator C2.

The larger the initial capacity of the follower capacitor C2, the larger must also be the ratio between the voltage $U_A$ (between points 14 and 16 of the coil in the oscillatory circuit) to the voltage U appearing across the whole of the coil L. Moreover the position of the tapping 14 also depends on the range of frequency variation, i.e. the larger the range of frequency variation, the larger must also be the ratio $U_A/U$. In practice this ratio is chosen to be roughly between 1/3 and 1/2.

What we claim is:

1. Tunable multi-band oscillator apparatus, comprising:
a plurality of oscillators mounted on a flower-like array of sector-shaped circuit boards;
a plurality of capacitor stators, at least one of said capacitor stators mounted on each of said circuit boards and included in the corresponding oscillator; and
a rotatably mounted capacitor rotor capacitively co-operating with each of said capacitor stators as a common tuning device.

2. The apparatus set forth in claim 1, comprising means operative to switch from one of said oscillators to another including switching means for selectively coupling operating power to said oscillators.

3. The apparatus set forth in claim 1, wherein each of said circuit boards carries a pair of mutually independent stator bodies, one of said bodies co-operating with said rotor as the tuning capacity for the corresponding oscillator and the other of said stator bodies co-operating with said rotor to form a further variable follower capacity.

4. The apparatus set forth in claim 1, wherein each of said stator bodies includes a peripheral shape which establishes in co-operation with said rotor the desired frequency variation of the corresponding oscillators.

5. The apparatus set forth in claim 1, wherein said capacitor rotor includes a plate section, said plate section being reduced in size as compared with the full angular range of rotation of 360° for the rotor by the expression $$360° - \frac{360°}{X}$$

wherein X is the number of circuit boards.

6. The apparatus set forth in claim 1, wherein said rotor comprises a pair of axially spaced rotor plates, and wherein said stators are provided on said sector boards and said sector boards are disposed between said pair of axially spaced rotor plates.

7. The apparatus set forth in claim 1, comprising a housing, and wherein said rotor includes a plate and is capacitively coupled to ground potential through said plate co-operating with said housing.

8. The apparatus set forth in claim 1, wherein each of said circuit boards carries said capacitor stators mounted on both faces thereof and metal coatings on the edges of said boards connecting the stators thereof.

9. The apparatus set forth in claim 1, wherein said rotor comprises a pair of axially spaced rotor plates and wherein said circuit boards carry a plurality of said capacitor stators thereon and said circuit boards are disposed between said pair of spaced apart rotor plates, and wherein said circuit boards are characterized by a first co-efficient of thermal expansion, and wherein said apparatus further comprises means for holding said rotor plates in said spaced apart relation having a second co-efficient of thermal expansion which is similar to said first co-efficient of thermal expansion for temperature compensation of the oscillator.

10. The apparatus according to claim 9, wherein said circuit boards are made of ceramic and the means for holding said rotor plates in a spaced apart relation is made of a metal of a similar thermal expansion characteristic to the ceramic of said circuit boards.

11. The apparatus set forth in claim 1, comprising a common output terminal and a plurality of decoupling resistors connected between the individual oscillators and said output terminal.

12. The apparatus set forth in claim 1, wherein each of said oscillators has a resonant frequency and a range of oscillations, and wherein said apparatus comprises means operative to switch from one of said oscillators to another including switching means for selectively coupling operating power to said oscillators, and wherein said oscillators are arranged with respect to said switching means so that the frequency range of one oscillator has its resonant frequency lying outside the frequency range of the next following oscillating unit.

13. The apparatus set forth in claim 1, wherein said rotor includes a shaft, and wherein said apparatus further comprises a housing for said plurality of oscillators and a cylindrical drum enclosing said housing and drivingly connected to said shaft, said cylindrical drum carrying indicating scales for the individual oscillators.

14. The apparatus set forth in claim 1, wherein said apparatus comprises an odd number of oscillators and said rotor includes a rotor plate for coupling to said oscillators, said rotor plate including an unused angular sector that is equal to or less than 360° divided by the number of oscillators.

15. The apparatus set forth in claim 1, wherein each of said circuit boards carries a pair of mutually independent capacitor stators, one of said stators co-operably coupled to said rotor to form the tuning capacitor for the corresponding oscillator and the other of said stators co-operably coupled to said rotor to form a further variable follower capacity in parallel to the tuning capacity, and wherein the said apparatus includes means co-operably coupled to said rotor to form a capacity that is in series with the tuning and following capacities.

16. The apparatus set forth in claim 15, comprising an adjustable capacity connected in series with said follower capacity said adjustable capacity including an input connection for receiving a control voltage for controlling its capacity.

17. The apparatus set forth in claim 1, wherein said rotor comprises a pair of axially spaced rotor plates and each of said circuit boards carries a pair of capacitor stators coupled to said rotor to provide a tuning capacity and a follower capacity, said apparatus further comprising an adjustable capacity having an input terminal for receiving a control voltage for adjusting said adjustable capacity and a coil included in the oscillator having a tap, said adjustable capacity and said follower capacity being serially connected to said tap of said coil and further comprising a trimming capacitor connected to said follower capacitor and further connected to said coil.

18. The apparatus set forth in claim 17, comprising a trimming capacitor connected between said adjustable capacity and said follower capacity.

19. The apparatus according to claim 17, comprising a fixed capacitor connected in parallel to said adjustable capacity.

References Cited

UNITED STATES PATENTS

| | | | |
|---|---|---|---|
| 2,244,023 | 6/1941 | Sauer | 334—48 |
| 2,840,713 | 6/1958 | Wulfsberg | 331—49 |

ROY LAKE, Primary Examiner

S. H. GRIMM, Assistant Examiner

U.S. Cl. X.R.

331—56, 68, 117, 177; 332—30; 334—15, 52, 82